United States Patent

Hastings et al.

[11] 4,052,788
[45] Oct. 11, 1977

[54] TOOL FOR REMOVING A SNAP-IN BUSHING FROM A MOUNTING PANEL HOLE

[75] Inventors: Jerome K. Hastings, Sussex; Earl T. Piber, Oconomowoc, both of Wis.

[73] Assignee: Cutler-Hammer, Inc., Milwaukee, Wis.

[21] Appl. No.: 702,760

[22] Filed: July 6, 1976

[51] Int. Cl.$^2$ .......................................... B25B 27/14
[52] U.S. Cl. ........................................ 29/764; 29/278; 279/1 E; 279/43
[58] Field of Search .......... 29/200 D, 200 H, 203 H, 29/235, 238, 427, 278, 750, 751, 752, 764, 566.4; 279/1 E, 43, 50

[56] References Cited

U.S. PATENT DOCUMENTS

| 3,210,836 | 10/1965 | Johanson et al. | 29/203 H X |
| 3,903,577 | 9/1975 | Phillips | 29/278 X |

Primary Examiner—Othell M. Simpson
Assistant Examiner—Z. R. Bilinsky
Attorney, Agent, or Firm—Hugh R. Rather; William A. Autio; Michael E. Taken

[57] ABSTRACT

A tool for removing a snap-in bushing type toggle switch or the like from a hole in a mounting panel. The tool is molded of plastic material and is provided with a spring-biased self-opening slidable chuck snap-in assembled within a compressor tube and is adapted to squeeze the snap-in collar or skirt of the snap-in bushing so that it becomes released from the mounting panel. The outer compressor tube having a mushroom handle at one end is adapted to slide forwardly over the chuck to compress or squeeze it and the snap-in collar therewithin. A spring-biased ejector pin slidable within the chuck is depressed by the toggle lever of the switch and is loaded by its spring compressed by the compressor tube and serves to snap the switch from the panel hole upon release of the snap-in collar.

A first version has an integrally-molded resilient lug on the chuck that snaps out into an elongated slot in the compressor tube wall to snap-in assemble the chuck within the compressor tube for limited sliding movement. A second version has an integrally-molded hook on the chuck that slides along a groove in the compressor tube to engage a catch to snap-in assemble the chuck within the compressor tube for limited sliding movement.

8 Claims, 5 Drawing Figures

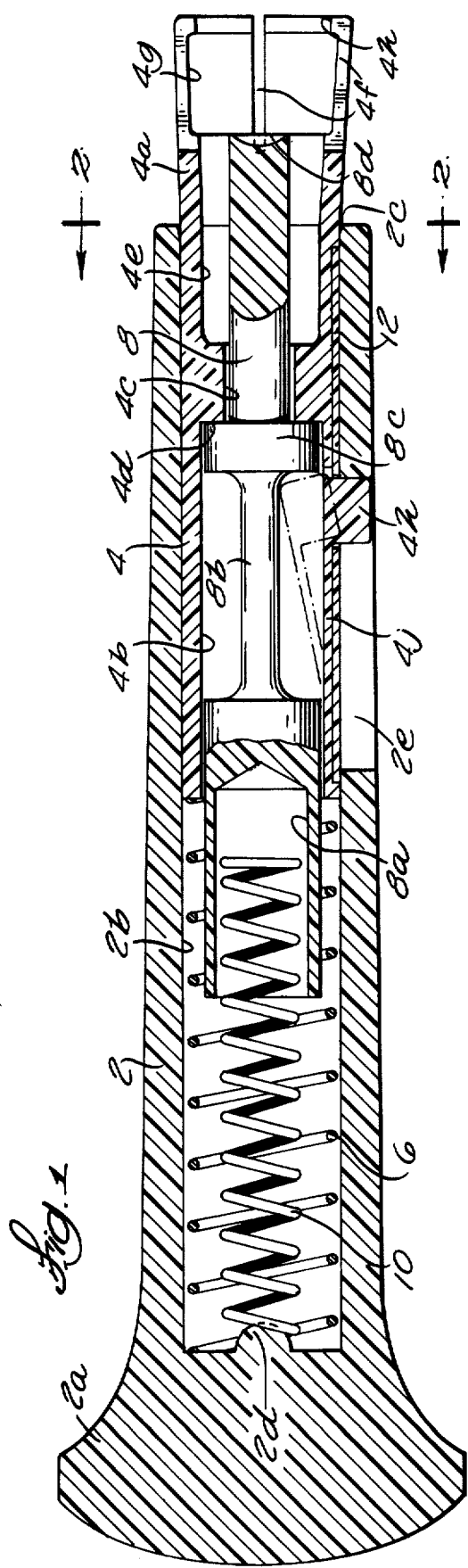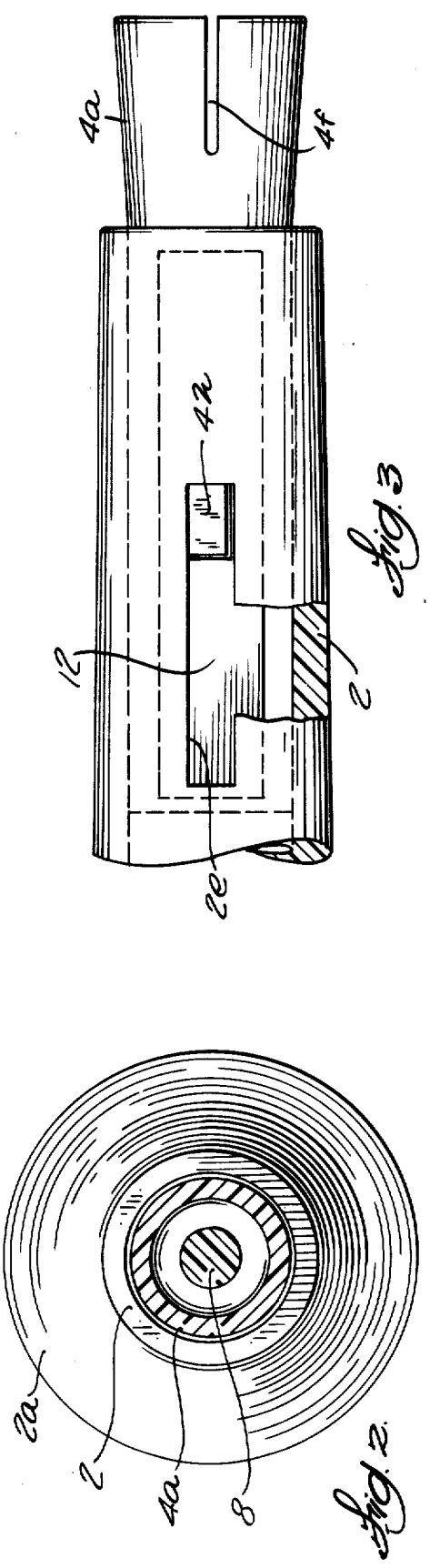

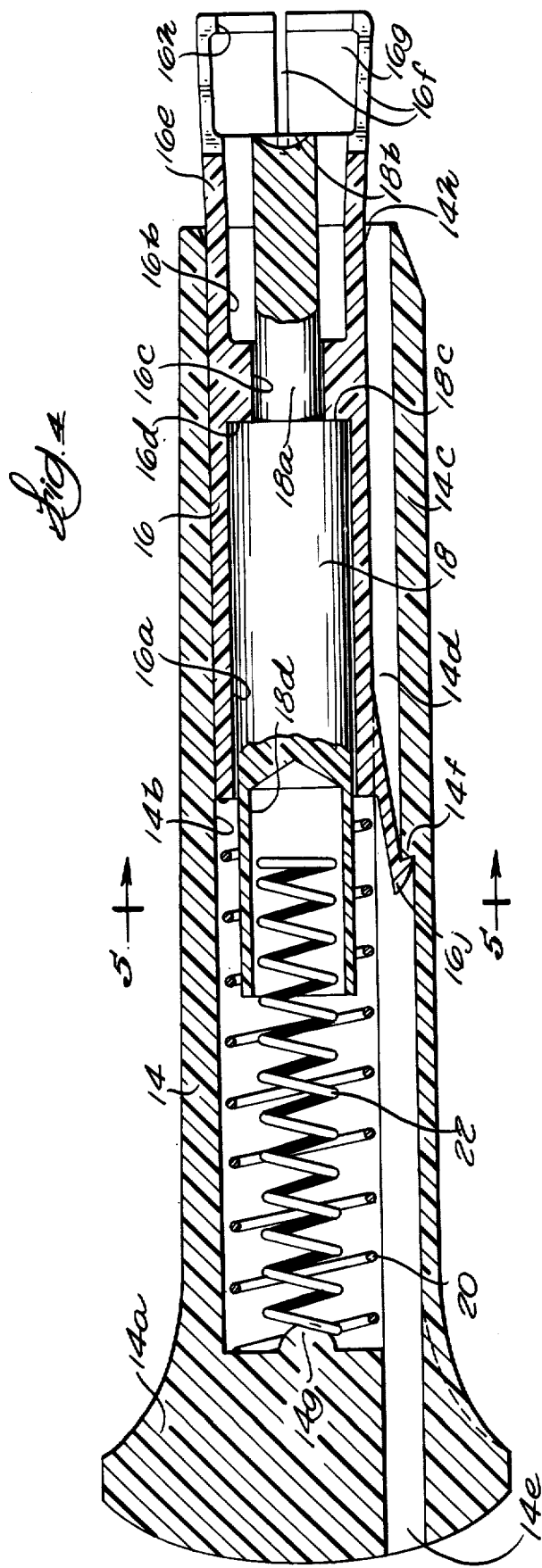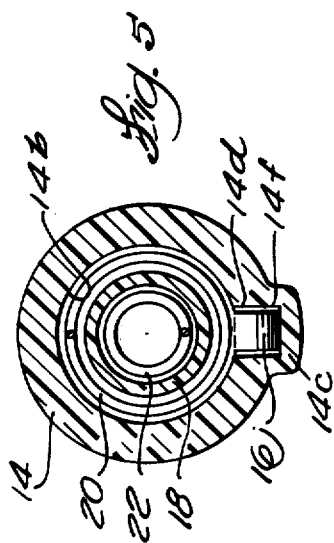

TOOL FOR REMOVING A SNAP-IN BUSHING FROM A MOUNTING PANEL HOLE

BACKGROUND OF THE INVENTION

In the use of the snap-in bushing type toggle switches such as disclosed in E. T. Piber U.S. Pat. No. 3,941,965, dated Mar. 2, 1976, and assigned to the assignee of this invention, it has been found desirable at times to remove these switches from the mounting panel. Due to the stiffness or semi-rigid nature of the plastic material from which the snap-in collar or skirt is made, difficulty has been encountered in attempts to squeeze it sufficiently to release it from the hole in the mounting panel. Switch removal has been attempted by use of a tube having a bore no larger than the hole in the panel. However, pushing such tube over the snap-in collar or skirt to squeeze it has a tendency to scrape and deform the collar and to spread out and flare its panel-contacting periphery even more on the front of the panel and to pinch its periphery between such tube and the face of the panel thereby damaging the collar while failing to release the switch. Consequently, it has been found desirable to provide a removal tool that effects quick removal of the switch without damaging the same.

CROSS-REFERENCE TO RELATED APPLICATION

J. K. Hastings copending application Ser. No. 695,915, filed June 14, 1976, and assigned to the assignee of this invention, discloses two versions of snap-in bushing switch removal tool. This invention relates to two versions of such removal tool differing therefrom in structure and including snap-in coupling of the chuck within the compressor tube.

SUMMARY OF THE INVENTION

An object of the invention is to provide an improved removal tool for a snap-in bushing switch that will effecct quick removal of the switch frame from its hole in the mounting panel.

A more specific object of the invention is to provide an automatic removal tool of the aforementioned type having a molded or cast one-piece compressor tube.

Another specific object of the invention is to provide a removal tool of the aforementioned type having snap-in assembly of the chuck for limited sliding movement within the compressor tube.

Another specific object of the invention is to provide an improved removal tool of the aforementioned type that is simple in construction and is easy and economical to assemble.

Other objects and advantages of the invention will hereinafter appear.

BRIEF DESCRIPTION OF THE DRAWINGS

FIG. 1 is an enlarged longitudinal cross-sectional view of a snap-in coupling version of a removal tool for a snap-in bushing switch and showing the internal parts and springs therefor.

FIG. 2 is a lateral cross-sectional view taken along line 2—2 of FIG. 1 to show the round configuration of the parts; and FIG. 3 is a bottom view of the right-hand portion of the tool of FIG. 1 to show the snap-in coupling parts of the chuck and compressor tube.

FIG. 4 is an enlarged longitudinal cross-sectional view of a second snap-in coupling version of a removal tool showing the internal parts thereof; and FIG. 5 is a lateral cross-sectional view taken along line 5—5 of FIG. 4 to show the configuration of the snap-in assembly groove in the compressor tube.

DESCRIPTION OF THE PREFERRED EMBODIMENT

Referring to FIGS. 1-3, there is shown a first version of snap-in bushing switch removal tool constructed in accordance with the invention. The tool as illustrated therein is a molded plastic type although certain parts thereof could alternatively be cast of metal. This removal tool is provided with an external compressor tube 2 having an integrally molded mushroom handle 2a closing one end and a round bore 2b therein open at the other end, there being a small diverging bevel 2c at the mouth of this bore to facilitate sliding of this compressor tube over the self-spreading end 4a of chuck 4 hereinafter described. As shown in FIG. 2, handle 2a is round and has a convex outer surface for engagement by the user's palm when the tool is applied in use.

Chuck 4 is a molded plastic member arranged within the compressor tube for limited extension therefrom and is biased in the right-hand direction by a chuck-return, helical spring 6 compressed between the closed end of the compressor tube bore adjacent handle 2a and the annular inner end of the chuck. This chuck is generally tubular in form and has a large bore 4b within its inner end portion and a constriction providing reduced bore 4c at its middle portion and an annular shoulder 4d forming a stop for ejector pin 8. This chuck has a larger bore 4e also at its external end portion beyond the aforesaid constriction.

The right-hand, external end of the chuck that normally projects out of the compressor tube is provided with means for embracing and squeezing the snap-in collar of the switch when the compressor tube is slid thereover. This means comprises a divided and flared section such as a quadriformed, self-spreading chuck portion 4a having a bore that is a continuation of and slightly diverges from bore 4e and four elongated, radial slits 4f spaced 90° apart to divide the chuck portion into a quadriform as shown in FIG. 1. The outer diameter of this chuck portion 4a slightly diverges also so as to provide substantially uniform thickness of the quadriform portion of the right-hand end. A flat ring-shaped cutout or enlargement 4g of bore 4e is slightly spaced from the right end of chuck portion 4a, this cutout being wide enough to overlap the tips of the whole range of heights used for the snap-in collars used on these switches. The lip 4h at the extreme extended end of the chuck portion is provided with a diameter slightly larger than bore 4e to facilitate insertion thereof, without scraping, over the flared collar of the snap-in bushing of the switch. However, the diameter of this lip is smaller than cutout 4g so as to afford squeezing of the flared edge of the snap-in collar immediately adjacent the mounting panel small enough to re-enter the hole in the mounting panel without having to apply enough force to squeeze the snap-in collar throughout its entire length. Once this collar is started going through the panel hole, this lip will squeeze the rest of it as the ejector pin snaps the switch out behind the panel.

As shown in FIG. 1, ejector pin 6 is generally cylindrical but having several different diameters along its length for different purposes. Its inner end is provided with a diameter to slide freely into bore 4b of the chuck. This inner end is provided with a partial bore 8a for accommodating one end of an uncompressed helical ejector spring 10, the other end of which abuts the closed end of bore 2b of the compressor tube while this ejector spring extends concentrically within spring 6. Compressor tube 2 is provided with a semi-spherical boss 2d at the closed end of its bore for centering ejector spring 10 within spring 6.

The central portion of the ejector pin beyond bore 8a is provided with a small diameter section 8b to provide clearance for lug 4h when the chuck, ejector pin and two springs are simultaneously snap-in assembled into the compressor tube. Beyond small diameter section 8b, there is an annular flange 8c of equal diameter with the inner end portion to fit freely within bore 4b of the chuck. Beyond flange 8c, the ejector pin has an intermediate diameter section all the way to its right-hand end slidable freely through the constricted bore 4c of the chuck. The right-hand end 8d of this ejector pin may be concave to retain the end of the toggle lever of the switch with which it is used.

As shown in FIG. 1, snap-in lug 4h is integrally molded with the chuck and is connected by an integrally-molded spring strip 4j to the left end of a rectangular slot in the wall of the chuck. The outer wall of the chuck around such rectangular slot is recessed enough to provide space for a stiff, fishpaper shield 12 having a slot in it large enough to allow projection of lug 4h. To allow sliding movement of the chuck within the compressor tube, the compressor tube is provided with a rectangular slot 2e to provide clearance for sliding of lug 4h. The fishpaper shield 12 closes the opening of slot 2e in the compressor tube and is long enough as shown in FIGS. 1 and 3 to cover this opening throughout the relative movement of the chuck and shield within the compressor tube.

To assemble the tool parts, the ejector pin is inserted into the chuck bore against shoulder 4d, fishpaper shield 12 is placed in its slot, and ejector spring 10 is inserted into bore 8a of the ejector pin to form a subassembly. Chuck return spring 6 is then inserted into the bore in the compressor tube. The subassembly is then pressed into the compressor tube bore by first guiding spring 10 and the ejector pin within spring 6 and then inserting the chuck into the compressor tube bore far enough so that lug 4h abuts the end of the compressor tube. This lug is then pressed inwardly to the broken line position shown in FIG. 1 so that the subassembly can be pressed further into the compressor tube bore against the force of spring 6 and suitably adjusted so that lug 4h snaps out through the small slot in fishpaper shield 12 into slot 2e of the compressor tube as shown in solid lines in FIG. 1. This lug snap-in locks the parts together while allowing sliding depression of the compressor tube relative to thechuck against the force of its return spring 6 and depression of the ejector pin to take up the lost motion and compress ejector spring 10. This lost motion allows use of the tool with switches having different length toggle levers.

If it becomes necessary to disassemble the tool, this can be done readily by depressing lug 4h and pulling the chuck out of the compressor tube bore. The ejector pin and its spring will then come out freely.

The second snap-in coupling version shown in FIGS. 4 and 5 comprises a compressor tube 14 having an integrally-molded mushroom handle portion 14a and a round bore 14b extending from the handle portion to the open right-hand end. This compressor tube has a round configuration as shown in FIG. 5 with an integral rib 14c extending along its lower side as illustrated in FIG. 5 providing clearance for a stepped groove 14d extending along the lower side of bore 14b and continuing in a hole 14e through the mushroom handle portion. This groove 14d is stepped in that the handle end half of it is deeper than the open end half so as to provide a sawtooth catch 14f at about the middle for snap-in retention of chuck 16 for limited sliding movement as hereinafter described. Hole 14e in the handle portion is provided by a molding insert and affords access for entry of a tool to release the snap-in chuck if it should become desirable to remove it.

Chuck 16 is a generally tubular molded member having an inner end bore 16a and an outer end bore 16b of substantially uniform diameter separted by a constriction providing a reduced diameter bore 16c at approximately its mid-portion and also providing an annular shoulder 16d serving as a stop for an ejector pin 18 hereinafter described. Outer end portion 16e of the chuck normally extends out of the open end of the compressor tube and is slightly flared and provided with slits 16f at 90° intervals. A flat ring-shaped cutout or internal groove 16g within bore 16b is slightly spaced from the right-hand end of the chuck, this groove being wide enough to overlap the tips of the whole range of heights used for the snap-in collars used on these switches. The lip 16h at the extreme extended end of the chuck is provided with a diameter slightly larger than bore 16b to facilitate insertion thereof, without scraping, over the flared collar of the snap-in bushing of the switch. However, the diameter of this lip is smaller than cutout 16g so as to afford squeezing of the flared edge of the snap-in collar of the switch bushing immediately adjacent the mounting panel small enough to re-enter the hole in the mounting panel without having to apply enough force to squeeze the snap-in collar throughout its entire length. Once this collar is started going through the panel hole, this lip will squeeze the rest of it as the ejector pin snaps the switch out behind the panel.

The chuck is provided with an intergrally molded hook 16j for snap-in assembly of the chuck into the compressor tube bore so as to engage catch 14f. A chuck return spring 20 of helical form is compressed between the annular inner end of the chuck and the closed end of the compressor tube bore.

Ejector pin 18 has a uniform diameter throughout about two-thirds of its length large enough to fit freely into bore 16a of the chuck with the remainder thereof having a reduced diameter to provide a tip 18a extending through reduced bore 16c of the chuck as shown in FIG. 4 with the end 18b of this tip being concave to retain the end of the toggle lever of the switch being removed from the panel. The shoulder 18c between the large diameter section and the reduced diameter section 18a stops against shoulder 16d of the chuck to limit the movement of the ejector pin and retain it within the tool. The ejector pin is also provided with a partial bore 18d at its inner end for retaining one end of an uncompressed helical ejector spring 22, the other of this spring bearing against the closed end of compressor tube bore 14b. A semi-spherical boss 14g is integrally molded at the closed end of this bore for centering the smaller diameter ejector spring 22 concentrically within the relatively larger diameter chuck return spring 20.

The mouth at the open end of the compressor tube is provided with a small bevel 14h to facilitate sliding thereof over the flared end of the chuck.

This tool is assembled by first inserting the ejector pin into the bore of the chuck against shoulder 16d and then inserting ejector spring 22 in the partial bore in the ejector pin to form a subassembly. Next, the chuck return spring is inserted in the compressor tube bore. Finally, the subassembly is inserted into the compressor tube bore by first inserting spring 22 into spring 20, squeezing hook 16j so that it will enter groove 14d, and then pressing the subassembly into the compressor tube bore against the force of spring 20 until hook 16j snaps behind catch 14f to connect the parts together. As shown in FIG. 1, spring 22 stops short of the end of partial bore 18d and thus the ejector pin has some lost motion to allow use of the tool with the full range of different lengths of toggle levers that are used on switches.

To use either version of removal tool, the extended chuck is placed over the toggle lever and snap-in bushing of the switch to be removed from the mounting panel. The user then pushes with the palm of his hand against the mushroom handle. As a result, the end of the toggle lever enters the concavity in the end of the ejector pin and the latter slides back within the chuck to take up the lost motion and compress the ejector spring slightly until the forward end of the chuck abuts the mounting panel around the snap-in brushing. The user continues to push so that the compressor tube slides over the chuck against the force of the chuck return spring and compresses the ejector spring further until the compressor tube abuts the mounting panel. During this motion, the compressor tube compresses or squeezes the flared end of the chuck to also compress the snap-in bushing collar of the switch small enough to release it from the hole in the panel. As a result, the ejector pin acts under the force of its spring to snap the switch from the panel.

While the apparatus hereinbefore described is effectively adapted to fulfill the objects stated, it is to be understood that the invention is not intended to be confined to the particular preferred embodiments of tools for removing snap-in bushings from mounting panel holes disclosed, inasmuch as they are susceptible of various modifications without departing from the scope of the appended claims. For example, while both versions have been shown as including an ejector pin and ejector spring, it will be apparent that these parts might be omitted whereby the switch would be manually removed from the back of the mounting rather than being automatically ejected.

We claim:

1. A removal tool for releasing a snap-in bushing switch having a snap-in collar from its hole in a mounting panel comprising:
   an elongated compressor member having a tubular section open at its forward end and having a spring abutment at its rear end;
   an elongated chuck member extending rearwardly into the open forward end of said tubular section of said compressor member and having a divided and flared, self-expanding tubular section at its forward end forming a chuck normally projecting from said open end of said compressor member to an initial condition far enough to allow self-expansion thereof so that it is adapted to be placed about the snap-in bushing collar of the switch against the mounting panel;
   a return spring within the rear portion of said compressor member forwardly of said abutment and engaging said chuck member;
   and snap-in coupling means operable when said chuck member is inserted rearwardly into the open forward end of said tubular section of said compressor member against said return spring for coupling the two members together to provide a stop so that said chuck member cannot be moved forwardly from its said initial condition but said compressor member can be depressed forwardly along said chuck member against the force of said return spring to cause its tubular forward section to squeeze said chuck and the snap-in bushing collar therewithin small enough to slip back through the hole in the mounting panel for removal of the switch.

2. A removal tool for releasing a snap-in bushing switch from its hole in a mounting panel comprising:
   an elongated chuck member having a divided and flared tubular section at one end forming a chuck that is adapted to be placed about the snap-in bushing collar of the switch;
   a compressor member having a tubular section closely surrounding said chuck member and adapted to be pushed over said divided and flared tubular section thereby to squeeze said chuck and the snap-in bushing collar therewithin small enough to slip through the hole in the mounting panel for removal of the switch;
   snap-in means coupling said chuck member within said compressor member and providing a stop for limited extension of the flared tubular section of said chuck from the tubular end of said compressor member;
   a spring within said compressor member biasing said chuck member against said stop from which it may be depressed against the force of said spring;
   and said snap-in means comprising:
   an elongated slot in said tubular section of said compressor member;
   and a depressible spring-biased lug on said chuck member extending into said slot to limit reciprocal movement of said chuck member within said compressor member.

3. The removal tool defined in claim 2, wherein: said depressible spring biased lug comprises an elongated strip having an enlarged end portion integrally molded with said chuck member and extending along a corresponding slot in the wall of said chuck member with said strip serving as a leaf spring to afford depression of said enlarged end portion to allow entry of said chuck member into said tubular section of said compressor member and causing said enlarged end portion to snap out into said elongated slot on assembly.

4. A removal tool for releasing a snap-in bushing switch from its hole in a mounting panel comprising:
   an elongated chuck member having a divided and flared tubular section at one end forming a chuck that is adapted to be placed about the snap-in bushing collar of the switch;
   a compressor member having a tubular section closely surrounding said chuck member and adapted to be pushed over said divided and flared tubular section thereby to squeeze said chuck and the snap-in bushing collar therewithin small enough to slip through the hole in the mounting panel for removal of the switch;

snap-in means coupling said chuck member within said compressor member and providing a stop for limited extension of the flared tubular section of said chuck from the tubular end of said compressor member;

a spring within said compressor member biasing said chuck member against said stop from which it may be depressed against the force of said spring; and said snap-in means comprising:

a catch within said tubular section of said compressor member;

and a hook on said chuck member engaging said catch to limit extension of said chuck from said compressor member while permitting depression of said chuck member against the force of said spring.

5. The removal tool defined in claim 4, wherein said snap-in means also comprises:

a groove within said tubular section of said compressor member in which said catch is located;

and said hook is resilient so as to be depressible to slide along said groove on assembly, and said hook having a self-bias to cause it to snap behind said catch to prevent removal of said chuck member from said compressor member.

6. The removal tool defined in claim 5, wherein: said compressor member comprises an opening leading into said groove for entry of a tool for releasing said hook from said catch.

7. A removal tool for releasing a snap-in bushing switch having a snap-in annular collar from its hole in a mounting panel comprising:

a tubular compressor member having an enlarged handle portion terminating its rear end and having a tubular open forward end;

a tubular chuck member extending rearwardly partway into the open tubular forward end of said compressor member and having a quadriform flared chuck at its forward end that normally extends out of said open tubular forward end of said compressor member to an initial position far enough to allow self-expansion thereof so that it is adapted to be placed about the snap-in bushing collar of the switch against the mounting panel;

a return spring within said compressor member between said handle portion and said chuck member normally biasing said chuck member to said initial position so as to effect said limited projection of said quadriform flared chuck from said tubular open end of said compressor member;

snap-in coupling means effective when said chuck member is inserted rearwardly into said tubular compressor member against said return spring for coupling said chuck member within said compressor member so as to afford a stop to prevent forward movement of said chuck member from its said initial position while allowing depression of said compressor member forward relative thereto against the force of said return spring to cause the open end portion thereof to squeeze said chuck and the snap-in bushing collar therewithin small enough to slip through the hole in the mounting panel for removal of the switch;

and ejector means within said tubular chuck member and said tubular compressor member for ejecting the switch from the panel hole upon being released.

8. The removal tool defined in claim 7, wherein said ejector means comprises:

an ejector pin within said tubular chuck member;

means limiting forward movement of said ejector pin relative to said chuck member;

an ejector spring between said ejector pin and the rear handle end of said compressor member;

and said ejector pin being depressible by the actuator of the switch from said limiting means and said depression of said compressor member being effective to compress said ejector spring thereby to snap the switch behind the mouting panel upon being released.

* * * * *